US008963585B2

(12) United States Patent
Lobsiger et al.

(10) Patent No.: US 8,963,585 B2
(45) Date of Patent: *Feb. 24, 2015

(54) GATE DRIVER UNIT FOR ELECTRICAL SWITCHING DEVICE

(71) Applicant: ABB Research Ltd, Zürich (CH)

(72) Inventors: Yanick Lobsiger, Aarau (CH); Dominik Bortis, Zürich (CH); Johann Walter Kolar, Zürich (CH); Matti Laitinen, Kirkkonummi (FI)

(73) Assignee: ABB Research Ltd, Zurich (CH)

( * ) Notice: Subject to any disclaimer, the term of this patent is extended or adjusted under 35 U.S.C. 154(b) by 0 days.

This patent is subject to a terminal disclaimer.

(21) Appl. No.: 13/964,366

(22) Filed: Aug. 12, 2013

(65) Prior Publication Data

US 2013/0328599 A1 Dec. 12, 2013

Related U.S. Application Data

(62) Division of application No. 13/275,819, filed on Oct. 18, 2011, now Pat. No. 8,604,841.

(30) Foreign Application Priority Data

Oct. 22, 2010 (EP) .................................... 10188454

(51) Int. Cl.
*H03K 17/30* (2006.01)
*H03K 17/12* (2006.01)
(Continued)

(52) U.S. Cl.
CPC ................ *H03K 17/30* (2013.01); *H03K 17/12* (2013.01); *H03K 17/10* (2013.01); *H03K 17/28* (2013.01); *H03K 17/082* (2013.01); *H02M 1/088* (2013.01)
USPC ............................ 327/108; 327/434; 323/285

(58) Field of Classification Search
CPC ....... H03K 17/12; H03K 17/082; H03K 1/28; H03K 17/10; H93M 1/088
USPC ......... 327/108, 109, 110, 111, 112, 382, 392, 327/393, 394, 395, 399, 401, 403, 404, 427, 327/434, 436; 323/266, 285; 361/88, 93.9
See application file for complete search history.

(56) References Cited

U.S. PATENT DOCUMENTS 5,566,063 A 10/1996 Gerster et al.
5,616,970 A 4/1997 Dittrich
(Continued)

OTHER PUBLICATIONS

European Search Report issued on Apr. 4, 2011 for European Application No. 10188454.2.
(Continued)

*Primary Examiner* — Jung H Kim
(74) *Attorney, Agent, or Firm* — Buchanan Ingersoll & Rooney PC

(57) ABSTRACT

An exemplary apparatus and method for using intelligent gate driver units with distributed intelligence to control antiparallel power modules or parallel-connected electrical switching devices like IGBTs is disclosed. The intelligent gate drive units use the intelligence to balance the currents of the switching devices, even in dynamic switching events. The intelligent gate driver units can use master-slave or daisy chain control structures and instantaneous or time integral differences of the currents of parallel-connected switching devices as control parameters. Instead of balancing the currents, temperature can also be balanced with the intelligent gate driver units.

3 Claims, 4 Drawing Sheets

(51) Int. Cl.
*H03K 17/10* (2006.01)
*H03K 17/28* (2006.01)
*H03K 17/082* (2006.01)
*H02M 1/088* (2006.01)

(56) References Cited

U.S. PATENT DOCUMENTS

| | | | |
|---|---|---|---|
| 5,712,587 | A | 1/1998 | Schauder et al. |
| 6,285,235 | B1 | 9/2001 | Ichikawa et al. |
| 7,071,661 | B2 | 7/2006 | Thalheim |
| 2007/0152730 | A1 | 7/2007 | Wagoner et al. |

OTHER PUBLICATIONS

Dominik Bortis et al., Active Gate Control for Current Balancing of Parallel-Connected IGBT Modules in Solid-State Modulators, IEE Transactions on Plasma Science, vol. 36, No. 5, Oct. 2008, pp. 2632-2637.

Patrick Hofer-Noser et al., Monitoring of Paralleled IGBT/Diode Modules, IEEE Transactions on Power Electronics, vol. 14, No. 3, May 1999, pp. 438-444.

B Abdi et al., Problems Associated with Parallel Performance of High Current Semiconductor Switches and their Remedy, International Symposium on Power Electronics, Electrical Drives, Automation and Motion, SPEEDAM 2008, pp. 1379-1383.

Fuji IGBT Modules Application Manual, Fuji Electric Device Technology Co., Ltd., www.fujisemiconductor.com, Feb. 2004.

GATE DRIVER UNIT FOR ELECTRICAL SWITCHING DEVICE

RELATED APPLICATION

The present application is a Divisional Application of U.S. application Ser. No. 13/275,819 filed Oct. 18, 2011, which claims priority to European Patent Application No. 10188454.2 filed in Europe on Oct. 22, 2010, the entire content of which is hereby incorporated by reference in its entirety.

FIELD

The present disclosure relates to electrical switching devices, such as controlling gate-controlled electrical switching devices, such as MOSFETs, IGBTs, and BJTs, for example.

BACKGROUND INFORMATION

Parallel-connected switching devices can be used in applications where high current throughput is specified. The parallel connection is used in inverter bridges feeding high current AC- or DC-loads.

A known problem associated with the parallel-connected switching devices is that currents through the switching devices are seldom evenly balanced. FIG. 1 illustrates examples of uncompensated schematic current waveforms for three parallel-connected IGBTs in accordance with known systems. The waveforms show unbalanced current distribution due to differentiating turn-on and turn-off times. Unbalanced currents cause uneven wear and tear in the switching devices. The uneven wear and tear in turn reduces the lifetime of the switching devices. Further, unbalanced currents may cause a switching device to reach its maximum temperature rating or maximum current rating faster than when the currents are in balance.

In known implementations, parallel-connected power electronic switching devices can be derated or additional passive components can be added in the current path to reduce the current imbalance, as disclosed in publication B. Abdi, A. H. Ranjbar, K. Malekian, J. Milimonfared, and G. B. Gharehpetian, "Problems associated with parallel performance of high current semiconductor switches and their remedy," in Proc. Int. Symp. Power Electronics, Electrical Drives, Automation and Motion SPEEDAM 2008, 2008, pp. 1379-1383. However, this approach can be inefficient and costly.

Selection of a component with similar characteristics can also be used as a tool to solve the problem, as disclosed in publication Fuji IGBT module application manual, www.fujisemiconductor.com, 2004. However, handpicking the components adds production costs.

In a publication by Dominik Bortis, Juergen Biela, Johann W. Kolar, "Active gate control for current balancing of parallel-connected IGBT modules in solid-state modulators", IEEE Transactions on Plasma Science, vol. 36, no. 5, pp. 1379-1383., an active current balancing by gate controlling circuits is proposed. This publication discloses utilization of centralized intelligence only. The disclosed method requires a relatively complex measurement and communication system to operate.

SUMMARY

An exemplary apparatus is disclosed that comprises two or more parallel or series connected electrical switching devices, each switching device having a control terminal, and one or more of intelligent gate driver units including: a control output connected to the control terminal of one of the switching devices; means for receiving turn-on and turn-off commands for the switching device; means for receiving feedback information on turn-on and turn-off events of the switching device; means for receiving reference information on turn-on and turn-off events of another switching device; means for calculating a value for a control parameter on the basis of the feedback information and the reference information; and means for controlling, based on a switching device command and the control parameter, a control signal at the control output to control the switching device.

An exemplary method for controlling a plurality of switching devices through at least one intelligent gate driver unit is disclosed. For each intelligent gate driver unit, the method comprises receiving turn-on and turn-off commands for a switching device, receiving feedback information on turn-on and turn-off events of one of the switching devices; receiving reference information on turn-on and turn-off events of another switching device; calculating a value for a control parameter on the basis of the reference information and feedback information; and controlling, on the basis of a switching device command and the control parameter, a control signal at control outputs of the intelligent gate driver unit, the output being connected to the control terminal of the switching device.

Another exemplary apparatus is disclosed. The apparatus comprising two or more parallel or series connected electrical switching devices, each switching device having a control terminal, and one or more of intelligent gate driver units having a control output connected to the control terminal of one of the switching devices, wherein the one or more intelligent gate driver units is connected to receive turn-on and turn-off commands for the switching device, receive feedback information on turn-on and turn-off events of the switching device, receive reference information on turn-on and turn-off events of another switching device, calculate a value for a control parameter on the basis of the feedback information and the reference information, and control a control signal at the control output to control the switching device based of a switching device command and the control parameter.

BRIEF DESCRIPTION OF THE DRAWINGS

In the following the disclosure will be described in greater detail by means of preferred embodiments with reference to the accompanying drawings, in which

DESCRIPTION OF THE DRAWINGS

Figure 1:
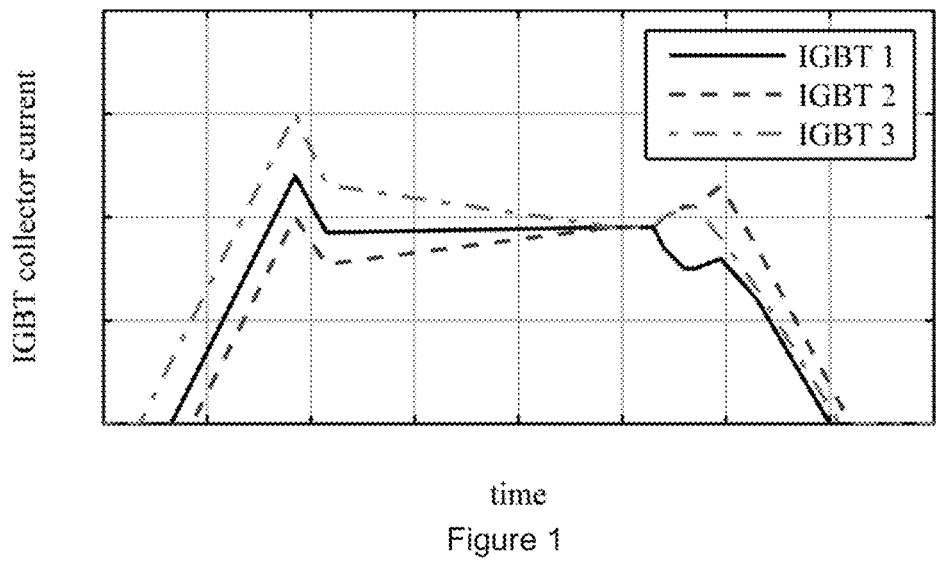
Figure 2:
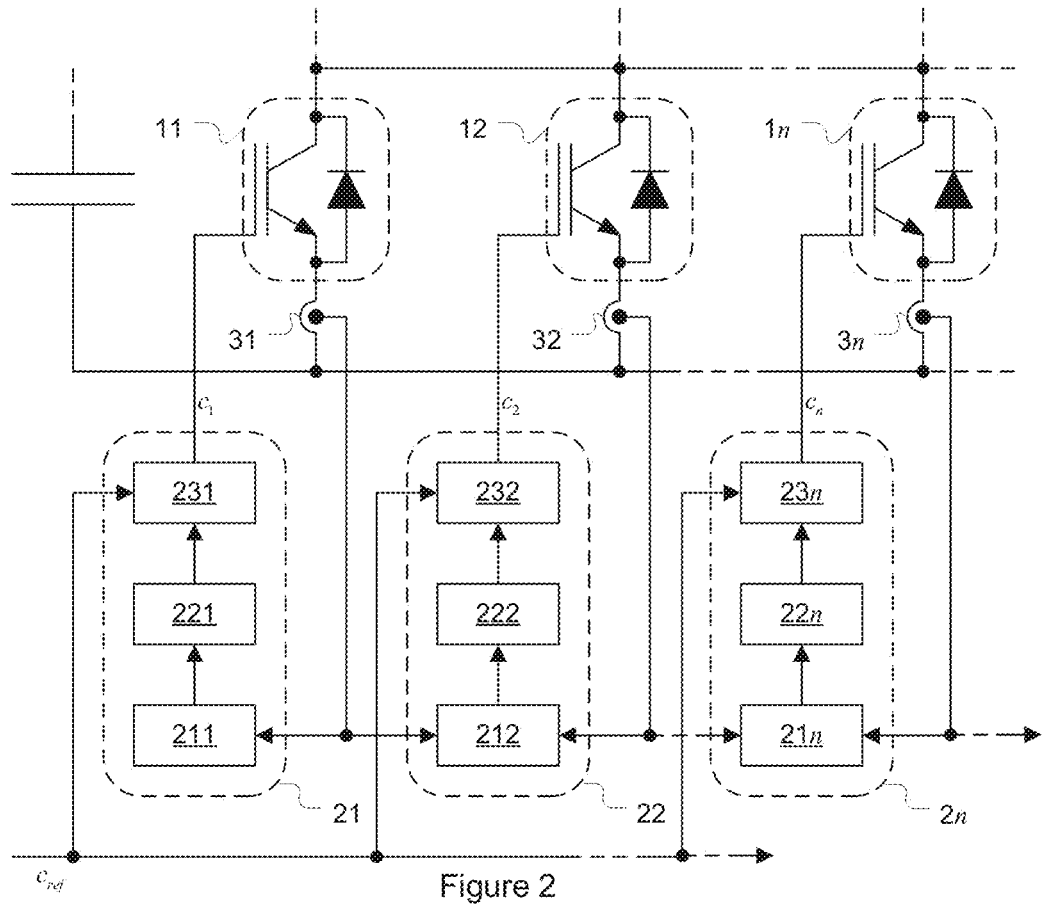
Figure 3:
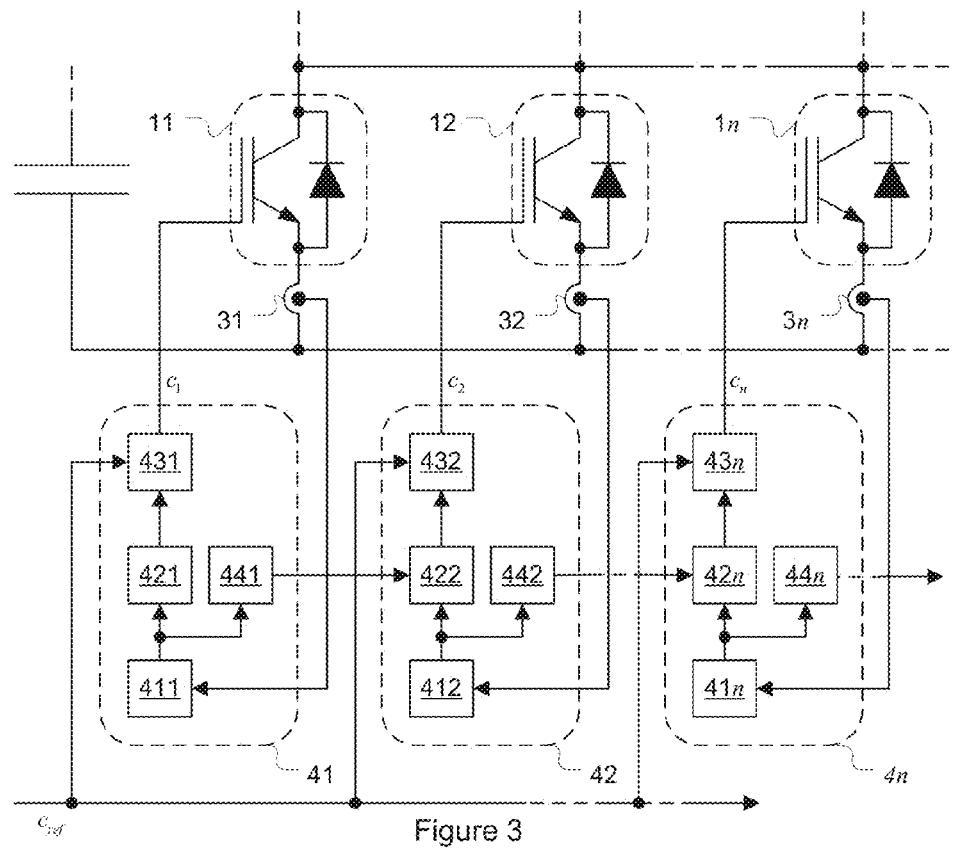
Figure 4:
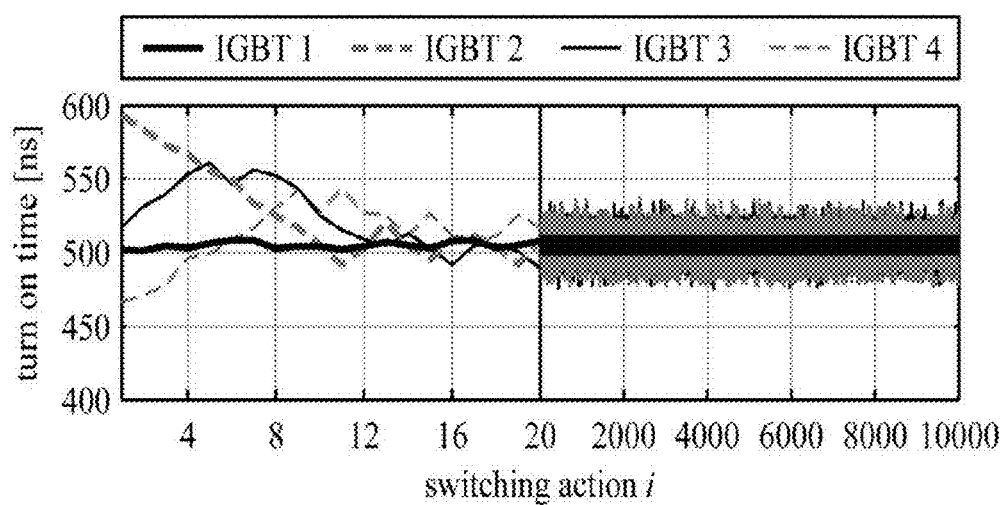
Figure 5:
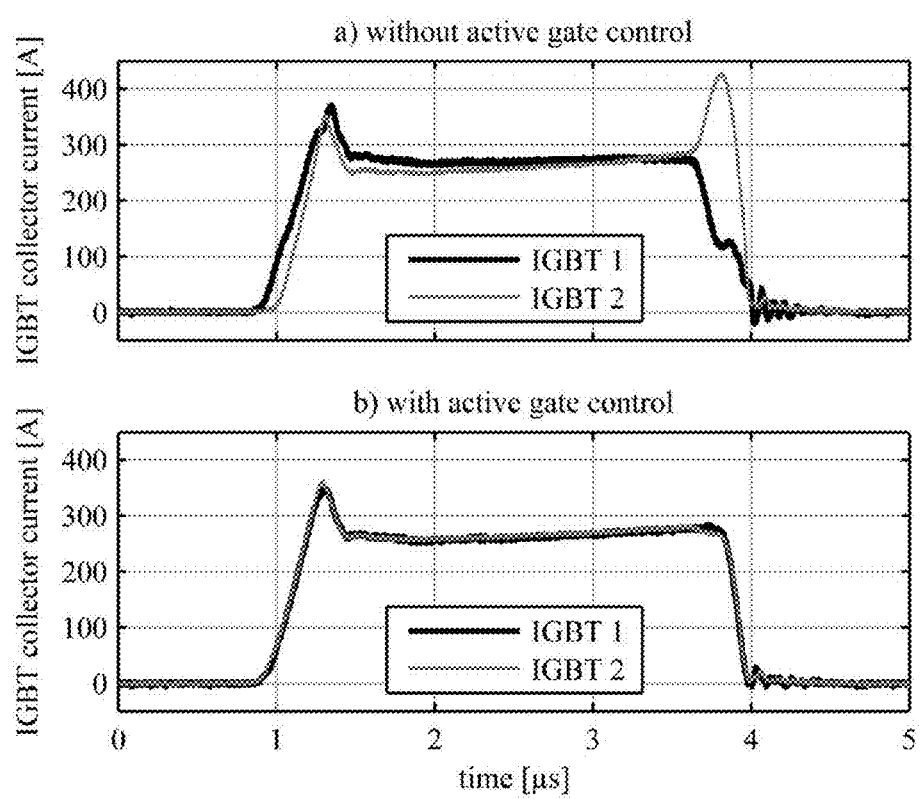
Figure 6:
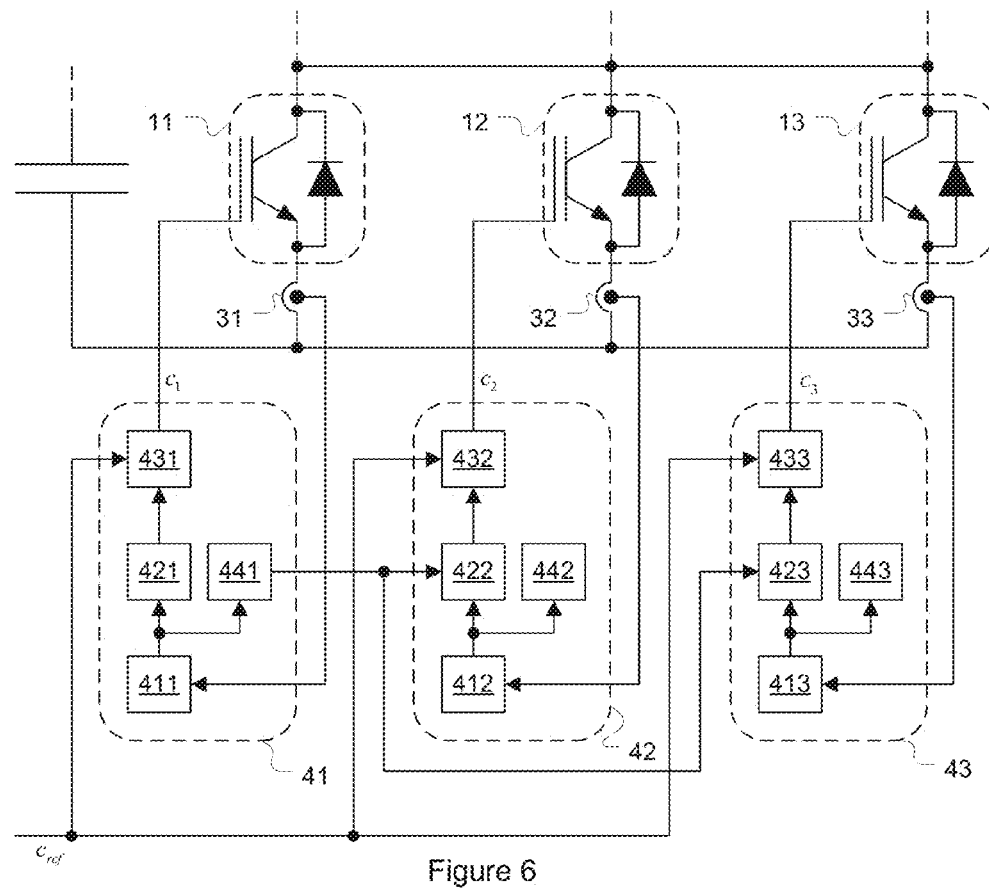
Figure 7:
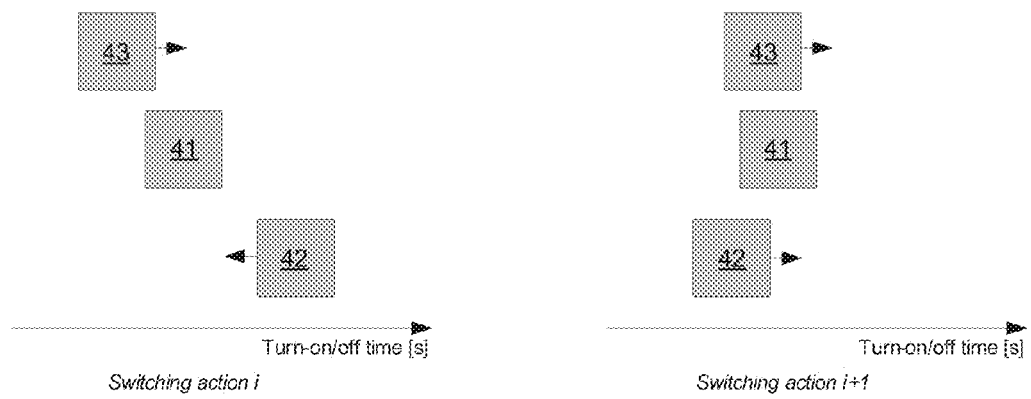

FIG. 1 illustrates examples of uncompensated schematic current waveforms for three parallel-connected IGBTs in accordance with known systems;

FIG. 2 is illustrates a simplified diagram of parallel-connected switching devices in accordance with an exemplary embodiment of the present disclosure;

FIG. 3 illustrates parallel-connected switching devices having means for communicating reference information in accordance with exemplary embodiment of the present disclosure;

FIG. 4 illustrates convergence of switching times of four switching devices in accordance with an exemplary embodiment of the present disclosure;

FIG. 5 illustrates measured waveforms with and without active switching time correction in accordance with an exemplary embodiment of the present disclosure;

FIG. 6 illustrates an embodiment of the present disclosure, using a master-slave topology in accordance with an exemplary embodiment of the present disclosure; and FIG. 7 illustrates adjustment of switching events to balance currents of parallel-connected switching devices in accordance with an exemplary embodiment of the present disclosure.

DETAILED DESCRIPTION

Exemplary embodiments of the present disclosure are directed to providing a method and an apparatus for implementing the method to alleviate the above disadvantages.

The exemplary embodiments use intelligent gate driver units (IGDU) with distributed intelligence to control parallel-connected electrical switching devices such as IGBTs, for example. The intelligence balances the currents of the switching devices, even in dynamic switching events. The IGDUs execute specified measurements independently and establish a specified communication between each other. They may use master-slave or daisy chain control structures and instantaneous or time integral differences of the currents of parallel-connected switching devices as control parameters.

In addition, instead of balancing the currents, the temperature can also be balanced with the intelligent gate driver units. Furthermore, the concept can also be applied to balance the voltages of antiparallel power modules.

An advantage of an exemplary method and apparatus of the present disclosure is that there is no longer a need for derating of parallel-connected power switching devices, or adding passive components to balance the currents, in dynamic switching events. The cost is therefore reduced. Removing the additional passive components also reduces total power losses.

Distributing intelligence allows more accurate control of individual switching devices as well as faster response to the dynamic changes and failures. It also facilitates specification of both upper control algorithms controlling the IGDUs and communication between an upper control algorithm and intelligent gate driver units.

An exemplary apparatus according to the present disclosure includes two or more parallel- or antiparallel electrical switching devices, each switching device having a control terminal. FIG. 2 is illustrates a simplified diagram of parallel-connected switching devices in accordance with an exemplary embodiment of the present disclosure. As shown in FIG. 2, switching devices 11 to 1n are implemented using power modules. A power module can, for example, contain a single switching device, a switching device and an antiparallel (freewheeling) diode (FWD), as in FIG. 2, or a half bridge made of these components. In an exemplary embodiment, a single power module can have more than one internally parallel-connected switching device. Also, other emerging topologies can be incorporated in a single power module.

Decentralized active gate control according to an exemplary embodiment of the present disclosure can be achieved by distributing calculation and correction of imbalance in currents. Thus, the exemplary apparatus includes one or more of intelligent gate driver units. In FIG. 2, intelligent gate driver units 21 to 2n for the electrical switching devices 11 to 1n are shown. In some embodiments, temperatures of the switching devices or voltages over the switching devices can be balanced instead of currents.

Each intelligent gate driver unit 21 to 2n includes a control output $c_1$ to $c_n$ which is adapted to be connected to a control terminal of one of the switching devices 11 to 1n. In FIG. 2, each of the intelligent gate driver units 21 to 2n is connected to a control terminal of one of the switching devices 11 to 1n. Each intelligent gate driver unit 21 to 2n controls a switching device 11 to 1n. The IGDUs can be equivalent to each other, thus lowering the manufacturing costs. Each IGDU is capable of operating independently.

Because an intelligent gate driver unit should control a switching device connected to it, each intelligent gate driver unit also includes means for receiving turn-on and turn-off commands for the switching device from an upper level control. The upper level control produces the turn-on and turn-off commands, based on a control algorithm, for example a PWM algorithm, to obtain a desired output voltage and current. The upper level control can, for example, be implemented using a CPU. The IGDUs share the same control input $c_{ref}$ from the upper control level. The control input forms a basis for switching events, but actual switching events can be adjusted by the intelligence in the IGDUs and the information shared between them. Transferring information back to the upper controller to adjust the switching events is not specified.

The intelligent gate driver units include means 211 to 21n for receiving feedback information on turn-on and turn-off events of the switching devices controlled by them. Minimum information specified to balance a dynamic current sharing includes both rising and falling edges of the current at turn-on and turn-off events, respectively. The means 211 to 21n for receiving feedback information can for example be a current measurement with edge detection. The rising and falling edges can be identified by direct current measurement with various methods, for example by using shunt resistors, current transducers or Rogowski coils. As shown in FIG. 2, means 31 to 3n are used for current measurement.

Edges can be detected as a voltage drop over an inductance, e.g., the bonding inductance, in the current path or by means of a related value to the current, e.g., the gate-emitter voltage of the semiconductor, as well. The edge information can be transferred into digital data by simple comparator circuits.

If an instantaneous, average or RMS value of current is used in balancing, current measurement is needed. For digitizing the instantaneous, average or RMS current data, A/D-conversion means and sampling algorithms can be specified in IGDUs. In some embodiments, IGDUs may include means for measuring a temperature of a temperature difference of a switching device.

For comparison with the feedback information, the intelligent gate driver units can include means 221 to 22n for receiving reference information on device turn-on and turn-off events of another switching device. The reference turn-on and turn-off events can be caused by switching devices controlled by other IGDUs. The switching device causing reference events does not always have to be controlled by an IGDU. For example, in embodiments with two parallel switching devices, one of the switching devices can be controlled with a known gate driver unit. The other switching device can be controlled with an intelligent gate driver unit, which receives its reference information from the switching device controlled by the traditional gate driver unit.

The reference information can be produced by the other IGDUs. One or more of the intelligent gate driver units can be connected to other intelligent gate driver units to receive reference information on turn-on and turn-off events of switching devices controlled by the other intelligent gate driver units. FIG. 3 illustrates parallel-connected switching devices having means for communicating reference information in accordance with an exemplary embodiment of the present disclosure.

As shown in FIG. 3, each IGDU 41 to 4n includes means 411 to 41n, 421 to 42n, and 431 to 43n similar to the means 211 to 21n, 221 to 22n, and 231 to 23n in FIG. 2, respectively. In addition, each IGDU 41 to 4n includes means 441 to 44n for sending reference information on switching events to the other IGDUs. The means 411 to 41n produce feedback information and the means 441 to 44n produce the reference information to be sent from the feedback information. The means 422 to 42n are adapted to be connected to the means 441 to 44(n−1) for receiving reference information of another intelligent gate driver unit. Each IGDU measures switching events of a switching device connected to the IGDU, and sends the switching event information to other IGDUs. In other words, the IGDUs receive their reference switching events directly from other IGDUs.

In another exemplary embodiment of the present disclosure, in addition to being able to detect the events of the switching device connected to the IGDU, each IGDU includes means to detect the events of another switching device. In other words, one or more of the intelligent gate driver units can be connected to other switching devices to receive reference information on turn-on and turn-off events. This embodiment is shown in FIG. 2.

The times of switching events can be aligned using a daisy chain approach. In the daisy chain approach, the intelligent gate driver units form a daisy chain adapted to pass reference information from one gate driver unit to another. For example, in FIG. 2, the IGDU on the left can be specified as the reference to the IGDU on the right. Thus, eventually, the left most IGDU becomes the reference, but the communication needs to be established only between the neighbours. In some embodiments of the present disclosure, the first switching device in the daisy chain does not have to be controlled by an IGDU. For instance, if the feedback information is received directly from an external current measurement, as in FIG. 2, the first gate driver unit can be a traditional gate driver unit.

In an exemplary embodiment, the IGDUs can be connected in a master-slave approach. In a master-slave approach, means for receiving reference information of two or more intelligent gate driver units can be connected into one source for reference information. For instance, one IGDU can be selected as a master whose switching event information is transferred to all other IGDUs as a reference. The other IGDUs then try to follow the master on the basis of the reference. The master can also be a switching device controlled by a traditional gate driver unit. For instance, if the other switching devices can be controlled by intelligent gate driver units which receive feedback information directly from an external current measurement, the master does not have to be an IGDU.

Both approaches are possible and the selection of the approach depends on the specific configuration. For example, if an IGDU measures its own and neighbouring currents, as in FIG. 2, the daisy chain approach can be more suitable.

The minimum reference information specified for the comparison is the time of the rising and falling edges. This information can be conveniently transferred as digital signals by using either electrical or optical transducers. The measurement and transforming of the data into digital form can be done in the IGDUs or by using separate means. If information other than reference information on switching events is also transferred between the IGDUs, the same channel can be used or parallel channels can be built. If the same channel is used, a message frame may have to be defined.

The electric potential of the IGDU can be freely selected, and the IGDUs can share the same potential. It can be appropriate that each IGDU is in the potential of the power module it is controlling. For an exemplary IGBT-module, this potential could be the potential of the auxiliary emitter. As a result, even though the power terminals of parallel power modules are electrically connected, the communication between the different IGDUs can be isolated due to transient voltages caused by high current change rates and stray inductances in the power modules and the busbars. The IGDUs can include the specified galvanic isolation. The means for sending or the means for receiving reference information on switching events may, for instance, include a galvanic isolation. The galvanic isolation can also be implemented by using separate means.

The feedback information can be used together with the reference information to determine the amount of unbalance. The IGDUs according to the present disclosure include means for calculating a value for a control parameter on the basis of the reference information and the feedback information.

In an exemplary embodiment, the intelligent gate driver units include means for determining a time of a reference switching device event on the basis of the received reference information and means for determining a time of a switching device event on the basis of the received feedback information. The control parameter can then be calculated on the basis of the time difference between the switching device event and the reference switching device event.

In some exemplary embodiments of the present disclosure, a time integral difference of the currents of parallel-connected switching devices can also be used. The time difference and time integral difference can be used alone or together as control parameters.

One or more previous events can be used in the calculation. Information on temperature or temperature difference can also be used as a control parameter.

An exemplary IGDU according to the present disclosure can also includes means for controlling, on the basis of the switching device command and the control parameter, a control signal at the control output to control the switching device. The controlling can, for instance, be done by means of adjusting the switching times or controlling the gate voltages. The control objective may be to balance the currents between the switching devices. In exemplary embodiments of the present disclosure, the temperature can be balanced by the intelligent IGDUs instead of balancing the currents. For this purpose, for example a coordinated exclusion of a switching device from the switching action or even from the conducting period can be applied. Furthermore, the concept may also be applied to balance the voltages of antiparallel power modules.

The IGDUs can also have tasks, such as over-current protection and advanced gate control, so the IGDUs can comprise various voltage and temperature measurements. The IGDU according to the present disclosure can also comprise means for sending feedback information to the upper control. This can be done directly or via the parallel IGDUs.

In an exemplary method according to the present disclosure, times of switching events of the parallel-connected switching devices can be brought closer to each other. FIG. 4 illustrates convergence of switching times of four switching devices in accordance with an exemplary embodiment of the present disclosure. The daisy chain strategy, similar to that illustrated in FIG. 2 or 3, was applied. As shown in FIG. 4, as the switching events of the parallel-connected switching devices approach each other, the currents become more balanced.

FIG. 5 illustrates measured waveforms with and without active switching time correction in accordance with an exemplary embodiment of the present disclosure. As shown in FIG. 5, measured waveforms for two parallel switches, with and without active switching time correction for the two parallel switches. The upper part of FIG. 5 shows an approximately 100 ns difference between the rising and falling edges of the two switching devices. This causes unbalance in the currents, particularly at the falling edges. The lower part of FIG. 5 illustrates better performance due to more accurate control. The currents are practically equal.

FIG. 6 illustrates an embodiment of the present disclosure, using a master-slave topology in accordance with an exemplary embodiment of the present disclosure. As shown in FIG. 6, three switching devices 11 to 13 are connected in parallel. Three IGDUs 41 to 43 control the switching devices 11 to 13. The IGDUs 41 to 43 are the same means as in FIG. 3, now using only one master IGDU 41 as a source for a reference for the other slave IGDUs 42 and 43. In this embodiment the switching events are adjusted to balance the currents of the parallel-connected switching devices.

FIG. 7 illustrates adjustment of switching events to balance currents of parallel-connected switching devices in accordance with an exemplary embodiment of the present disclosure. FIG. 7 provides a schematic description of an operational principle of the exemplary embodiment of FIG. 6. At a switching action i the slave IGDU 42 detects that its switching event happens after the master IGDU 41 switching event and it makes a correction so that the switching event happens earlier. The slave IGDU 43 detects that its switching event happens before the master IGDU 41 switching event and it makes a correction so that the switching event happens later. At switching action i+1, the slave IGDU 42 notices that the switching delay was over compensated and it makes a correction for a later switching event. The slave IGDU 43 still switches before the master IGDU 41 and the correction is for a later switching event. As depicted in FIG. 7, switching time adjusting is an ongoing action due to the jitter of digital sampling and other artifacts.

It will be obvious to a person skilled in the art that the inventive concept can be implemented in various ways. The embodiments of this document disclose apparatuses with parallel-connected switching devices. However, the method and intelligent gate driver units according to the present disclosure can also be used with series connected electrical switching devices to balance voltages over the switching devices. The disclosure and its embodiments are not limited to the examples described above but may vary within the scope of the claims.

Thus, it will be appreciated by those skilled in the art that the present disclosure can be embodied in other specific forms without departing from the spirit or essential characteristics thereof. The presently disclosed embodiments are therefore considered in all respects to be illustrative and not restricted. The scope of the disclosure is indicated by the appended claims rather than the foregoing description and all changes that come within the meaning and range and equivalence thereof are intended to be embraced therein.

What is claimed is:

1. An apparatus comprising:
three or more parallel or series connected electrical switching devices, each switching device having a control terminal, and
at least one intelligent gate driver unit including:
a control output connected to the control terminal of one of the switching devices;
a first receiving component configured to receive turn-on and turn-off commands for the switching device;
a second receiving component configured to receive feedback information on turn-on and turn-off events of the switching device;
a third receiving component configured to receive reference information signal identifying turn-on and turn-off events of one of the other switching devices;
a first calculating component configured to calculate a value for a control parameter on the basis of the feedback information and the reference information signal; and
a first controlling component configured to control, based on the turn-on-and turn-off command and the control parameter, a control signal at the control output to control the switching device,
wherein one of the switching devices is a master switching device, and the third receiving components of two or more of the intelligent gate driver units are commonly supplied with a master reference information signal identifying turn-on and turn-off events of only the master switching device as the reference information signal of the two or more of the intelligent gate driver units.

2. A method for controlling a plurality of switching devices through at least two intelligent gate driver units, wherein, for each intelligent gate driver unit, the method comprising:
receiving turn-on and turn-off commands for one of the switching devices,
receiving feedback information on turn-on and turn-off events of the one of the switching devices,
receiving a reference information signal identifying turn-on and turn-off events of one of the other switching devices;
calculating a value for a control parameter on the basis of the reference information signal and feedback information;
controlling, based on the turn-on and turn off commands and the control parameter, a control signal at a control output of the intelligent gate driver unit, the output being connected to the control terminal of the switching device;
selecting one of the switching devices as a common master switching device for two or more of the intelligent gate driver units; and
generating a master reference information signal identifying turn-on and turn- off events of only the master switching device, wherein the master reference information signal is commonly supplied to the two or more of the intelligent gate driver units as the reference information signal of the two or more of the intelligent gate driver units.

3. An apparatus comprising:
three or more parallel or series connected electrical switching devices, each switching device having a control terminal, and
at least one intelligent gate driver units each intelligent gate driver unit having a control output connected to the control terminal of one of the switching devices, wherein each of the at least two intelligent gate driver unit is configured to receive turn-on and turn-off commands for the switching device, receive feedback information on turn-on and turn-off events of the switching device, receive reference information signal identifying turn-on and turn-off events of one of the other switching devices, calculate a value for a control parameter on the basis of the feedback information and the reference information signal, and control a control signal at the control output to control the switching device based on the turn-on and turn-off commands and the control parameter,
wherein one of the switching devices is a master switching device, and two or more of the intelligent gate driver units are commonly supplied with a master reference information signal identifying turn-on and turn-off events of only the master switching device as the reference information signal of the two or more of the intelligent gate driver units.

* * * * *

UNITED STATES PATENT AND TRADEMARK OFFICE
CERTIFICATE OF CORRECTION

PATENT NO. : 8,963,585 B2  
APPLICATION NO. : 13/964366  
DATED : February 24, 2015  
INVENTOR(S) : Yanick Lobsiger et al.

Page 1 of 1

It is certified that error appears in the above-identified patent and that said Letters Patent is hereby corrected as shown below:

IN THE CLAIMS:

Column 7, Line 60: change "at least one intelligent gate driver unit including:" to -- at least two intelligent gate driver units, each intelligent gate driver unit including: --.

Signed and Sealed this  
Seventh Day of July, 2015

Michelle K. Lee  
*Director of the United States Patent and Trademark Office*